United States Patent
Gao

(10) Patent No.: US 9,698,175 B2
(45) Date of Patent: Jul. 4, 2017

(54) LIQUID CRYSTAL DISPLAY PANEL, ARRAY SUBSTRATE AND MANUFACTURING METHOD FOR THIN-FILM TRANSISTOR

(71) Applicant: Shenzhen China Star Optoelectronics Technology Co., Ltd., Shenzhen, Guangdong (CN)

(72) Inventor: Dongzi Gao, Guangdong (CN)

(73) Assignee: Shenzhen China Star Optoelectionics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/893,521

(22) PCT Filed: Apr. 2, 2015

(86) PCT No.: PCT/CN2015/075765
§ 371 (c)(1),
(2) Date: Nov. 23, 2015

(87) PCT Pub. No.: WO2016/149958
PCT Pub. Date: Sep. 29, 2016

(65) Prior Publication Data
US 2016/0343744 A1 Nov. 24, 2016

(30) Foreign Application Priority Data
Mar. 26, 2015 (CN) .......................... 2015 1 0136465

(51) Int. Cl.
*H01L 21/00* (2006.01)
*H01L 27/12* (2006.01)
(Continued)

(52) U.S. Cl.
CPC ........ *H01L 27/1262* (2013.01); *H01L 21/285* (2013.01); *H01L 21/28008* (2013.01);
(Continued)

(58) Field of Classification Search
None
See application file for complete search history.

(56) References Cited

U.S. PATENT DOCUMENTS

2005/0260804 A1* 11/2005 Kang ................ H01L 21/76804
438/164
2011/0069246 A1* 3/2011 Wang ................ G02F 1/133555
349/42
(Continued)

*Primary Examiner* — David E Graybill
(74) *Attorney, Agent, or Firm* — Andrew C. Cheng

(57) ABSTRACT

An LCD panel, an array substrate and a manufacturing method for TFT are disclosed. The method includes: providing a substrate; forming a first metal layer on the substrate, wherein the first metal layer includes an aluminum metal layer, an aluminum oxide layer and a molybdenum metal layer stacked sequentially; patterning the first metal layer to form a gate electrode of a TFT; sequentially forming a gate insulation layer, a semiconductor layer and an ohmic contact layer on the gate electrode; forming a second metal layer on the ohmic contact layer; and patterning the second metal layer to form a source electrode and a drain electrode of the TFT. The present invention can inhibit hillock generated by the aluminum metal layer in a high temperature environment, avoid the short circuit generated among the gate, the source and the drain electrodes of the TFT to ensure the display quality of an image.

4 Claims, 2 Drawing Sheets

(51) Int. Cl.
*H01L 21/285* (2006.01)
*H01L 21/28* (2006.01)
*H01L 29/49* (2006.01)
*H01L 29/786* (2006.01)
*H01L 21/77* (2017.01)

(52) U.S. Cl.
CPC .......... *H01L 27/12* (2013.01); *H01L 27/1244* (2013.01); *H01L 29/4908* (2013.01); *H01L 29/78678* (2013.01); *H01L 2021/775* (2013.01)

(56) References Cited

U.S. PATENT DOCUMENTS

| | | | | |
|---|---|---|---|---|
| 2012/0112182 | A1* | 5/2012 | Ishii | H01L 29/4908 257/43 |
| 2012/0190868 | A1* | 7/2012 | Miyata | C07D 495/04 549/41 |
| 2013/0187116 | A1* | 7/2013 | Tan | B82Y 10/00 257/4 |
| 2013/0323913 | A1* | 12/2013 | Miyata | H01L 51/0071 438/479 |
| 2014/0034899 | A1* | 2/2014 | Ahn | H01L 29/06 257/9 |
| 2014/0061616 | A1* | 3/2014 | Sunagawa | C07D 495/04 257/40 |
| 2014/0167257 | A1* | 6/2014 | Mujeeb-U-Rahman | H01L 21/28556 257/737 |
| 2015/0090975 | A1* | 4/2015 | Etori | H01L 51/0003 257/40 |
| 2015/0137131 | A1* | 5/2015 | Kim | H01L 51/5256 257/72 |
| 2015/0155309 | A1* | 6/2015 | Li | H01L 27/1225 257/43 |
| 2015/0311067 | A1* | 10/2015 | Sharma | H01L 21/02332 438/783 |
| 2015/0372097 | A1* | 12/2015 | Bao | H01L 29/0607 257/201 |
| 2016/0062162 | A1* | 3/2016 | Kang | G02F 1/1368 257/72 |

* cited by examiner

LIQUID CRYSTAL DISPLAY PANEL, ARRAY SUBSTRATE AND MANUFACTURING METHOD FOR THIN-FILM TRANSISTOR

BACKGROUND OF THE INVENTION

1. Field of the Invention

The present invention relates to liquid crystal display technology field, and more particularly to a liquid crystal display panel, an array substrate and a manufacturing method for a thin-film transistor of the both.

2. Description of Related Art

A Thin-Film-Transistor (TFT) is connected with a pixel electrode, and a gate electrode of the TFT is connected with a gate line of a liquid crystal display panel in order to turn on the TFT, when the gate electrode receives a gate driving signal. A source electrode of the TFT is connected with a data line of the liquid crystal display panel in order to transfer a received grayscale voltage to the pixel electrode to perform an image display. Currently, the panel supplier generally utilizes aluminum (Al) and molybdenum (Mo) metal to manufacture the TFT. Generally, a molybdenum metal layer is disposed on an aluminum metal layer. Besides, in order to decrease a resistance of the TFT, the aluminum metal layer is designed to be thicker. However, the melting point of the aluminum layer is lower (660° C.), and a high temperature environment required in the manufacturing process makes atoms of the aluminum metal layer to be extruded with each other so that the aluminum metal layer is easily to generate a hillock because of deformation cause by the extruding. When the hillock is serious, a short circuit will generated among the gate electrode, a source electrode and a drain electrode of the TFT in order to affect an image display quality of the liquid crystal display panel.

SUMMARY OF THE INVENTION

Accordingly, the embodiment of the present invention provides a liquid crystal display panel, an array substrate and a manufacturing method for a thin film transistor, which can inhibit the hillock generated by the deformation of the aluminum metal layer in a high temperature environment in order to ensure the display quality of an image.

A technology solution adopted by the present invention is to provide: a manufacturing method for a thin film transistor, comprising step of: providing a substrate; forming a first metal layer on the substrate, wherein the first metal layer includes an aluminum metal layer, an aluminum oxide layer and a molybdenum metal layer stacked sequentially; patterning the first metal layer in order to form a gate electrode of a thin film transistor; sequentially forming a gate insulation layer, a semiconductor layer and an ohmic contact layer on the gate electrode; forming a second metal layer on the ohmic contact layer; and patterning the second metal layer in order to form a source electrode and a drain electrode of the thin film transistor.

Wherein, the step of forming a first metal layer on the substrate comprises step of: utilizing a plasma to bombard an aluminum target for sputtering aluminum onto the substrate; injecting oxygen such that when aluminum is sputtering onto the substrate, simultaneously, the aluminum perform an oxidation reaction with the oxygen in order to form the aluminum oxide layer; and forming the molybdenum metal layer on the aluminum oxide layer.

Wherein, the second metal layer also includes an aluminum metal layer, an aluminum oxide layer and a molybdenum metal layer stacked sequentially.

Wherein, the method further comprises: forming a passivation layer on the source electrode and the drain electrode; forming a contact hole on the passivation layer in order to reveal the source electrode or the drain electrode; and forming a pixel electrode on the passivation layer, and the pixel electrode is electrically connected with one of the source electrode and the drain electrode through the contact hole.

Wherein, a dry etching method is utilized to form the contact hole.

Wherein, the substrate includes a base plate and an oxide layer formed on the base plate.

Another technology solution adopted by the present invention is to provide: an array substrate, comprising: a substrate; a thin-film-transistor array having multiple thin film transistors; and a pixel electrode; wherein, a gate electrode of the thin film transistor includes an aluminum metal layer, an aluminum oxide layer and a molybdenum metal layer stacked sequentially, the pixel electrode is electrically connected with one of a source electrode and a drain electrode of the thin film transistor through a contact hole.

Wherein, the source electrode and the drain electrode include an aluminum metal layer, an aluminum oxide layer and a molybdenum metal layer stacked sequentially.

Wherein, the thin film transistor further includes a gate insulation layer formed on the gate electrode, a semiconductor layer formed on the gate insulation layer and an ohmic contact layer formed on the semiconductor layer, a source electrode and a drain electrode formed on the ohmic contact layer.

Another technology solution adopted by the present invention is to provide: a liquid crystal display panel, comprising: an array substrate, including: a substrate; a thin-film-transistor array having multiple thin film transistors; and a pixel electrode; wherein, a gate electrode of the thin film transistor includes an aluminum metal layer, an aluminum oxide layer and a molybdenum metal layer stacked sequentially, the pixel electrode is electrically connected with one of a source electrode and a drain electrode of the thin film transistor through a contact hole.

Wherein, the source electrode and the drain electrode include an aluminum metal layer, an aluminum oxide layer and a molybdenum metal layer stacked sequentially.

Wherein, the thin film transistor further includes a gate insulation layer formed on the gate electrode, a semiconductor layer formed on the gate insulation layer and an ohmic contact layer formed on the semiconductor layer, a source electrode and a drain electrode formed on the ohmic contact layer.

In a liquid crystal display panel, an array substrate and a manufacturing method for a thin film transistor according to the embodiment of the present invention, through adding the aluminum oxide layer in manufacturing the aluminum metal layer and the molybdenum metal layer of the gate electrode, because the melting point and hardness of aluminum oxide is far higher than aluminum, the hillock generated by the deformation of the aluminum metal layer in a high temperature environment can be inhibited so that the short circuit generated among the gate electrode, the source electrode and the drain electrode of the thin film transistor can be avoided in order to ensure the display quality of an image.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
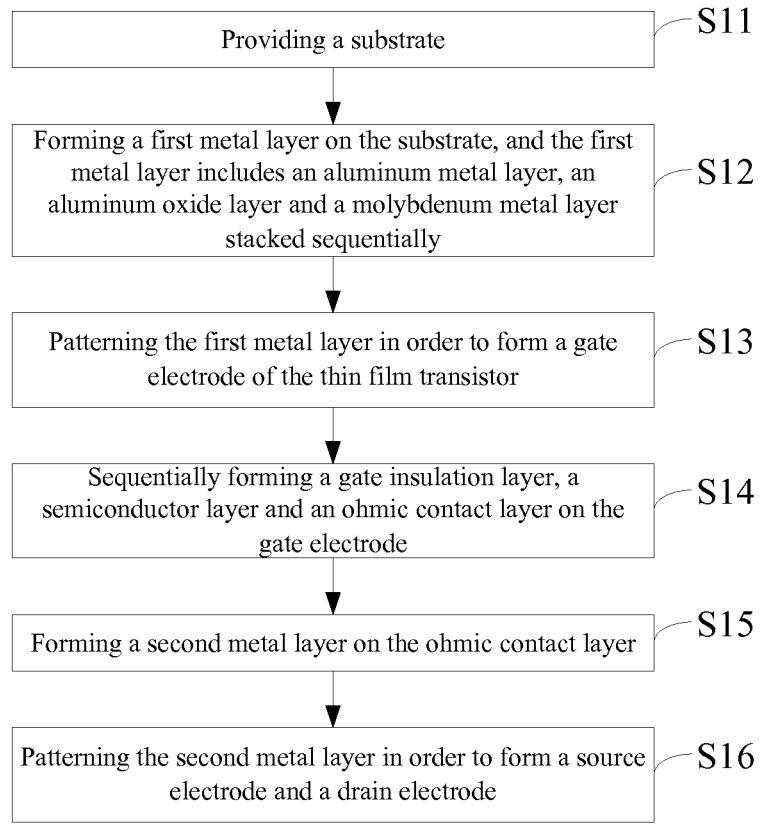
FIG. 1 is a flowchart of a manufacturing method for a thin film transistor according to an embodiment of the present invention.

FIG. 1 is a flowchart of a manufacturing method for a thin film transistor (TFT) according to an embodiment of the present invention. As shown in FIG. 1, the manufacturing method for the TFT includes following steps:

Step S11: providing a substrate.

Figure 2:
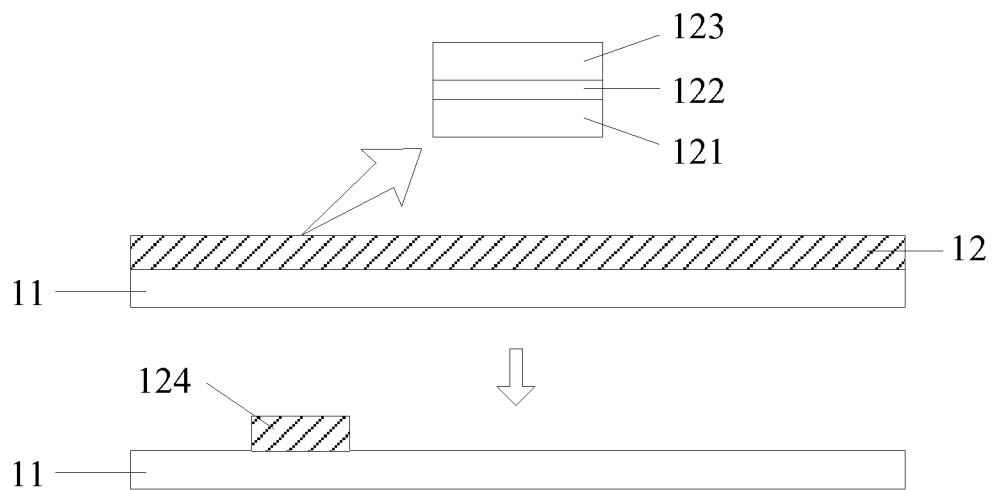
FIG. 2 is a schematic diagram of forming a gate electrode of the thin film transistor according to an embodiment of the present invention.

As shown in FIG. 2, the substrate 11 is used for forming an array substrate of a liquid crystal display panel. The substrate 11 can be a glass substrate, a plastic substrate or a flexible substrate.

Of course, the substrate 11 can also include a base plate and an oxide layer formed on the base plate. The oxide layer includes a $SiN_x$ layer, a $SiO_x$ layer or a combination of the $SiN_x$ layer and the $SiO_x$ layer. The oxide layer is used for prevent impurities in the base plate from diffusing upward so as to affect the quality of a low-temperature polysilicon (LTPS) thin film formed subsequently. The $SiN_x$ layer and the $SiO_x$ layer can be formed by the chemical vapor deposition (CVD) method or the plasma enhanced chemical vapor deposition (PECVD) method, and can also be formed by the sputtering method, the vacuum deposition method or the low pressure chemical vapor deposition method, and so on, but the present invention is not limited.

Step S12: forming a first metal layer on the substrate, and the first metal layer includes an aluminum metal layer, an aluminum oxide layer and a molybdenum metal layer stacked sequentially.

As shown in FIG. 2, the way of forming a first metal layer on the substrate can be: firstly, utilizing a plasma to bombard an aluminum target for sputtering aluminum onto the substrate 11 (or the above described oxide layer) in order to form the aluminum metal layer 121; then, when the step of sputtering aluminum onto the substrate 11 is almost completed, injecting an appropriate amount of oxygen such that when aluminum is sputtering onto the substrate, simultaneously, the aluminum perform an oxidation reaction with the oxygen in order to form the aluminum oxide layer 122 on a surface of the aluminum metal layer 121; finally, forming the molybdenum metal layer 123 on a surface of the aluminum oxide layer 122. Wherein, the embodiment of the present invention can utilize a magnetron sputtering method to form the aluminum metal layer 121 and the molybdenum metal layer 123 on the substrate 11 (or the above described oxide layer)

Step S13: patterning the first metal layer in order to form a gate electrode of the thin film transistor.

Specifically, etching the first metal layer 12 to form multiple gate electrodes of the liquid crystal display panel, wherein, utilizing an etching solution containing phosphoric acid, nitric acid, acetic acid and deionized water to perform etching the first metal layer 12. Of course, a dry etching method can also be utilized.

Step S14: sequentially forming a gate insulation layer, a semiconductor layer and an ohmic contact layer on the gate electrode.

Step S15: forming a second metal layer on the ohmic contact layer.

Step S16: patterning the second metal layer in order to form a source electrode and a drain electrode.

Figure 3:
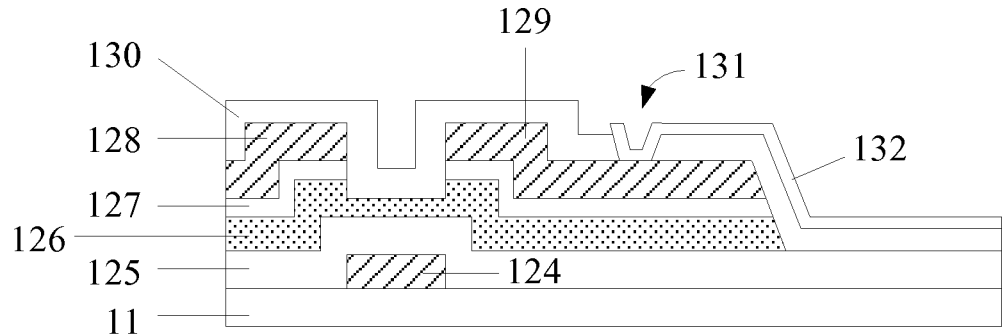
FIG. 3 is a schematic diagram of forming a source electrode and a drain electrode of the thin film transistor according to an embodiment of the present invention.

The present embodiment forms the gate insulation layer 125, the semiconductor layer 126, the ohmic contact layer 127, the source electrode 128 and the drain electrode 129 shown in FIG. 3 on the gate electrode 124 as shown in FIG. 2.

In the step S16, a same or a different patterning method for the first metal layer 12 can be utilized.

In the manufacturing method for the thin film transistor of the present invention, through adding the aluminum oxide layer 122 in manufacturing the aluminum metal layer 121 and the molybdenum metal layer 123 of the gate electrode 124, because the melting point and hardness of aluminum oxide is far higher than aluminum, the hillock generated by the deformation of the aluminum metal layer 121 in a high temperature environment can be inhibited so that the short circuit generated among the gate electrode 124, the source electrode 128 and the drain electrode 129 of the thin film transistor can be avoided in order to ensure the display quality of an image.

Subsequently, combined with the embodiment shown in FIG. 3, the manufacturing method of the thin film transistor further includes following steps:

Forming a passivation layer 130 on the source electrode 128 and the drain electrode 129.

Forming a contact hole 131 on the passivation layer 130 in order to reveal the drain electrode 129. Wherein, preferably, a dry etching method is utilized to form the contact hole 131.

Forming a pixel electrode 132 on the passivation layer 130, and the pixel electrode 132 is electrically connected with the drain electrode 129 through the contact hole 131. Besides, each gate electrode 124 of a TFT array is correspondingly and electrically connected with a gate line formed on the substrate 11 (an array substrate). Each source electrode 128 is correspondingly and electrically connected with a data line formed in the substrate 11 (an array substrate). The gate lines and the data lines are perpendicularly intersected in order to form a pixel display region where the pixel electrode 132 is located.

In another embodiment, the contact hole 131 can be formed on the passivation layer 130 in order to reveal the source electrode 128 such that the pixel electrode 132 is electrically connected with the source electrode 128 through the contact hole 131. At this time, the drain electrode 129 is correspondingly and electrically connected with the data line formed on the array substrate.

Figure 4:
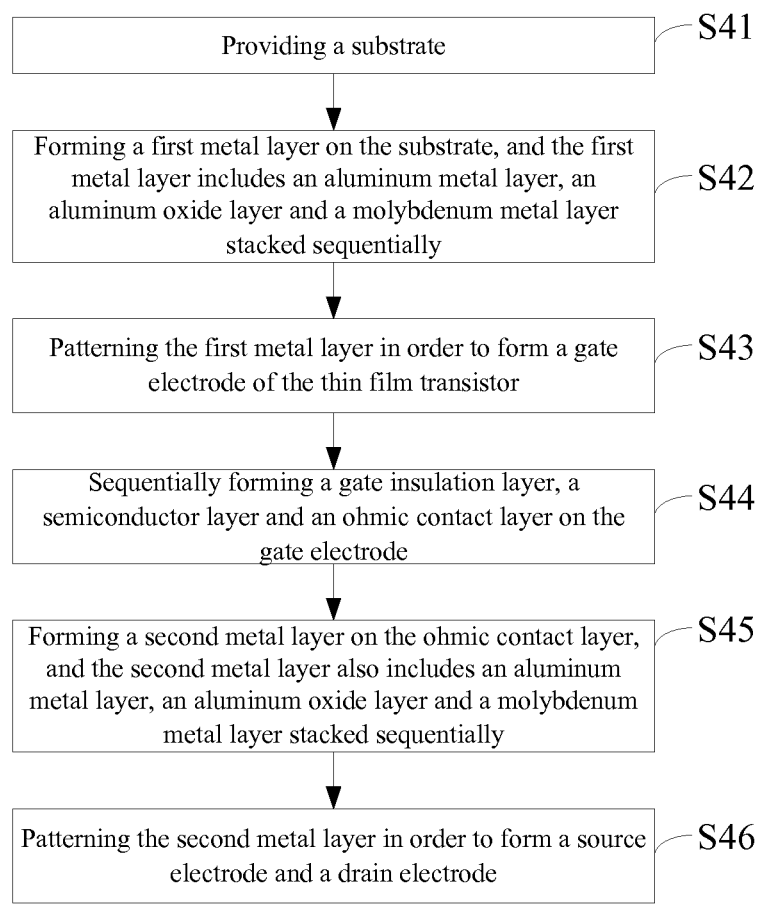
FIG. 4 is a flowchart of a manufacturing method for the thin film transistor according to another embodiment of the present invention.

FIG. 4 is a flowchart of a manufacturing method for a thin film transistor according to another embodiment of the present invention. The difference between the above embodiment and the present embodiment is: in the present embodiment, a material which is the same as the gate electrode 124 is used to manufacture the source electrode 128 and the drain electrode 129 of the thin film transistor. That is, the second metal layer used for manufacturing the source electrode 128 and the drain electrode 129 also includes the aluminum metal layer 121, the aluminum oxide layer 122 and the molybdenum metal layer 123 stacked sequentially.

As shown in FIG. 4, the manufacturing method of the thin film transistor of the present embodiment:

Step S41: providing a substrate.

Step S42: forming a first metal layer on the substrate, and the first metal layer includes an aluminum metal layer, an aluminum oxide layer and a molybdenum metal layer stacked sequentially Step S43: patterning the first metal layer in order to form a gate electrode of the thin film transistor.

Step S44: sequentially forming a gate insulation layer, a semiconductor layer and an ohmic contact layer on the gate electrode.

Step S45: forming a second metal layer on the ohmic contact layer, and the second metal layer also includes an aluminum metal layer, an aluminum oxide layer and a molybdenum metal layer stacked sequentially.

Step S46: patterning the second metal layer in order to form a source electrode and a drain electrode.

The embodiment of the present invention further provides an array substrate and a liquid crystal display panel utilizing the thin film transistor manufactured by the above manufacturing method. Accordingly, the same beneficial effects are provided.

In summary, in a liquid crystal display panel, an array substrate and a manufacturing method for a thin film transistor according to the embodiment of the present invention, through adding the aluminum oxide layer in manufacturing the aluminum metal layer and the molybdenum metal layer of the gate electrode, because the melting point and hardness of aluminum oxide is far higher than aluminum, the hillock generated by the deformation of the aluminum metal layer in a high temperature environment can be inhibited so that the short circuit generated among the gate electrode, the source electrode and the drain electrode of the thin film transistor can be avoided in order to ensure the display quality of an image.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A manufacturing method for a thin film transistor, comprising step of:
   providing a substrate;
   forming a first metal layer on the substrate, wherein the first metal layer includes an aluminum metal layer, an aluminum oxide layer and a molybdenum metal layer stacked sequentially, wherein, the aluminum metal layer is formed on and above the substrate, the aluminum oxide layer is formed on and above the aluminum metal layer, and the molybdenum metal layer is formed on and above aluminum oxide layer;
   patterning the first metal layer in order to form a gate electrode of a thin film transistor;
   sequentially forming a gate insulation layer, a semiconductor layer and an ohmic contact layer on the gate electrode;
   forming a second metal layer on the ohmic contact layer; and
   patterning the second metal layer in order to form a source electrode and a drain electrode of the thin film transistor;
   wherein, the step of forming a first metal layer on the substrate comprises step of:
   utilizing a plasma to bombard an aluminum target for sputtering aluminum onto the substrate;
   injecting oxygen when the step of sputtering aluminum onto the substrate is almost completed such that when the aluminum is sputtering onto the substrate, simultaneously, the aluminum perform an oxidation reaction with the oxygen in order to form the aluminum oxide layer; and
   forming the molybdenum metal layer on the aluminum oxide layer.

2. The manufacturing method according to claim 1, wherein, the second metal layer also includes an aluminum metal layer, an aluminum oxide layer and a molybdenum metal layer stacked sequentially, and the aluminum metal layer of the second metal layer is formed on and above the ohmic contact layer, the aluminum oxide layer of the second metal layer is formed on and above the aluminum metal layer of the second metal layer, and the molybdenum metal layer of the second metal layer is formed on and above the aluminum oxide layer of the second metal layer.

3. The manufacturing method according to claim 2 wherein, the method further comprises:
   forming a passivation layer on the molybdenum metal layer of the source electrode and the molybdenum metal layer of the drain electrode;
   forming a contact hole on the passivation layer in order to reveal the source electrode or the drain electrode; and
   forming a pixel electrode on the passivation layer, and the pixel electrode is electrically connected with one of the source electrode and the drain electrode through the contact hole.

4. The manufacturing method according to claim 3, wherein, a dry etching method is utilized to form the contact hole.

* * * * *